US012798960B2

(12) United States Patent
Engelhart et al.

(10) Patent No.: US 12,798,960 B2
(45) Date of Patent: Nov. 17, 2026

(54) MEMS TRANSDUCER, IN PARTICULAR FOR INTERACTING WITH A FLUID

(71) Applicant: Robert Bosch GmbH, Stuttgart (DE)

(72) Inventors: Peter Engelhart, St. Johann (DE); Bernhard Gehl, Wannweil (DE); Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 358 days.

(21) Appl. No.: 18/663,172

(22) Filed: May 14, 2024

(65) Prior Publication Data

US 2024/0400378 A1 Dec. 5, 2024

(30) Foreign Application Priority Data

May 30, 2023 (DE) ..................... 10 2023 205 018.8

(51) Int. Cl.
*B81B 3/00* (2006.01)

(52) U.S. Cl.
CPC .... *B81B 3/0086* (2013.01); *B81B 2201/0257* (2013.01); *B81B 2201/05* (2013.01); *B81B 2203/0127* (2013.01); *B81B 2203/033* (2013.01); *B81B 2203/04* (2013.01)

(58) Field of Classification Search
CPC ........ B81B 2201/0257; B81B 2201/05; B81B 2203/0127; H04R 2201/003; H04R 19/005
See application file for complete search history.

(56) References Cited

U.S. PATENT DOCUMENTS

2022/0194780 A1 * 6/2022 Loeppert ............... B81B 3/0086

FOREIGN PATENT DOCUMENTS

WO 2021144400 A1 7/2021
WO 2022117197 A1 6/2022

* cited by examiner

*Primary Examiner* — Kile O Blair
(74) *Attorney, Agent, or Firm* — NORTON ROSE FULBRIGHT US LLP

(57) ABSTRACT

A MEMS transducer interacting with a fluid. The MEMS transistor includes: a layer stack of at least three MEMS layer structures in a layer sequence, an active MEMS layer structure being formed between a lower MEMS layer structure and an upper MEMS layer structure; at least one lamella formed in the active MEMS layer structure and deflectable laterally for interacting with the fluid; and a drive device for deflecting the movable lamella in a lateral direction perpendicular to the layer sequence, with a lower and/or upper electrode structure, which is formed adjacent to the active MEMS layer structure on the lower and/or upper MEMS layer structure. For applying an electrical voltage to the upper and/or lower electrode structure, a through-connection of the upper or lower MEMS layer structure is provided, which is electrically conductively connected to a contact element formed in the active MEMS layer structure.

11 Claims, 8 Drawing Sheets

MEMS TRANSDUCER, IN PARTICULAR FOR INTERACTING WITH A FLUID

CROSS REFERENCE

The present application claims the benefit under 35 U.S.C. § 119 of German Patent Application No. DE 10 2023 205 018.8 filed on May 30, 2023, which is expressly incorporated herein by reference in its entirety.

FIELD

The present invention relates to MEMS transducers (MEMS: microelectromechanical system, microsystem), in particular MEMS actuators. The present invention relates in particular to MEMS transducers for interacting with a fluid, such as MEMS loudspeakers for sound generation or pumps or valves for microfluidics.

BACKGROUND INFORMATION

MEMS transducers designed to generate sound (also known as MEMS loudspeakers) are usually designed as planar structures in which a vibratory membrane is excited in such a way that the fluid is displaced and/or compressed vertically to the membrane plane. The excitation of such membranes typically takes place by means of a piezoelectric or electrostatic drive. For displacing a large volume of fluid, a correspondingly enlarged membrane surface is required, which scales with the substrate surface area of the MEMS transducer for design-related reasons.

PCT Patent Application No. WO 2021/144400 A1 provides a different concept for sound generation, which is not based on a single membrane vibrating in a vertical direction, but on a plurality of laterally or horizontally movable displacement elements, which displace a fluid in the vertical direction. In this case, the displaced volume of the fluid not only scales with the chip surface area but can also be influenced in the vertical dimension.

A MEMS component with a plurality of MEMS layers arranged along a layer sequence direction is also described in PCT Patent Application No. WO 2022/117197 A1. The MEMS component comprises a movable element which is formed in an active, first MEMS layer and arranged between a second and a third MEMS layer of the layer stack. A drive device has a first drive structure mechanically fixed to the movable element and a second drive structure mechanically fixed to the second and/or third MEMS layers. The drive device is designed to exert a drive force perpendicularly to the layer sequence direction on the movable element in order to deflect said element. In order to deflect the moving element, stray electric fields are provided via electrodes, which are arranged on the underside of the upper (third) MEMS layer or of the cover substrate and on the upper side of the lower (second) MEMS layer or of the base substrate.

SUMMARY

An object of the present invention is to specify a MEMS transducer that is improved in particular with regard to electrical contacting and/or mechanical stability.

The aforementioned object may be achieved by features of the present invention. Advantageous example configurations of the present invention are disclosed herein.

According to an example embodiment of the present invention, a MEMS transducer for interacting with a volume flow of a fluid, in particular for sound generation, comprises:

- a layer stack of at least three MEMS layer structures arranged one above the other in a layer sequence, an active MEMS layer structure being formed between a lower MEMS layer structure and an upper MEMS layer structure;
- at least one lamella (also: displacement element, displacement structure) which is formed in the active MEMS layer structure and is deflectable laterally at least in sections for interacting with the volume flow; and
- a drive device for deflecting the movable lamella at least in sections in a lateral direction perpendicular to the layer sequence, with a lower and/or upper electrode structure, which is formed adjacent to the active MEMS layer structure on the lower and/or upper MEMS layer structure. According to the present invention, for applying an electrical voltage to the upper and/or lower electrode structure, a through-connection of the upper or lower MEMS layer structure is provided, which is electrically conductively connected to a contact element formed in the active MEMS layer structure. The contact element is mechanically connected to the upper and the lower MEMS layer structure and thus stabilizes the multilayer structure produced, for example, by means of a wafer bonding process, in particular fusion bonding. The contact element is also electrically conductively connected to at least one drive electrode of the lower and/or the upper electrode structure and is electrically insulated from a substrate of the upper and lower MEMS layer structure in a region outside the through-connection.

In particular, according to an example embodiment of the present invention, the MEMS transducer can substantially be produced from a layer structure of three structured MEMS layer structures, which are optionally provided with local, in particular one-sided, surface conductive paths, and which are directly connected to one another in an edge-side bonding region.

The electrical contacting of the drive electrodes, arranged in all three wafer levels of the layer structure, which comprises the lower, the upper, and the active MEMS layer structures, is a particular challenge, which is essentially met by using the contact elements formed in the plane of the active MEMS layer structure as a supply line for the respective potentials to the respective drive electrodes. In addition to its actual function as a displacement structure for interacting with the fluid, the active MEMS layer structure thus also distributes the electrical potentials to the corresponding drive electrodes of the upper and/or lower MEMS layer structure.

According to an example embodiment of the present invention, the drive electrodes of the active MEMS layer structure are contacted via a through-connection of the upper or lower MEMS layer structure. The through-connection is, for example, contacted via a contact metallization on the surface of the upper or lower MEMS layer structure or via a bonding region, which is arranged on this plane and can preferably be connected using a wire bonding process. The contacting is designed in such a way that significant semiconductor volumes of the active, the upper, and the lower MEMS layer structure are electrically insulated from the live regions of the through-connection, of the contact element, of the drive electrodes, and/or of the lamellae.

According to an example embodiment of the present invention, the starting point for the application of potential is a region of the through-connection on a chip surface, in particular on the upper side of the upper MEMS layer structure or on the underside of the lower MEMS layer structure. In the region of the through-connection, an electrical voltage is locally applied to the upper or lower MEMS layer structure, in particular a stamp formed from the substrate of the upper or lower MEMS layer structure, on one side in such a way that this voltage level forms, in particular with a sufficiently high degree of doping, with low losses on the opposite side of the upper or lower MEMS layer structure in the layer sequence direction. Lateral isolation of the region of the stamp or of the through-connection in the upper and/or lower MEMS layer structure is achieved by lateral, vertically formed isolation trenches. Such structures are known as through-silicon vias (TSV).

In the context of this description, the direction of the layer sequence is also non-restrictively referred to as the vertical direction. A direction perpendicular thereto, i.e., a direction in the plane of the main extension plane of the MEMS layer structures or parallel thereto, is also referred to as the lateral direction.

According to an example embodiment of the present invention, the active MEMS layer structure of the MEMS transducer comprises a displacement structure for interacting with the fluid, in particular for sound generation, with at least one movable lamella, preferably with a plurality of movable, vertically aligned and electrically controllable lamellae. The active MEMS layer structure is also used for the mechanical suspension of the movable lamella and the mechanical connection thereof to the upper MEMS layer structure (also: lid wafer, top wafer) and the lower MEMS layer structure (also: base wafer, bottom wafer). The contact elements formed in the active MEMS layer structure are used to distribute the stray electric fields for driving the lamella and also as a mechanical support and connection structure for the top and bottom wafers.

According to an example embodiment of the present invention, the upper and lower MEMS layer structures respectively substantially comprise a substrate made of a semiconductor material, in particular silicon, which is preferably provided locally with one-sided surface conductive paths, in particular made of polycrystalline silicon, which are electrically insulated from the relevant substrate by suitable local insulation layers. These one-sided surface conductive paths of the upper and lower MEMS layer structures in particular form the drive electrodes of the MEMS transducer after bonding the MEMS layer structures in the layer sequence direction and/or form stripped regions for fastening the MEMS layer structures to one another.

The contact elements or contact structures make simple and cost-effective production of the MEMS transducer possible, in particular using conventional connection technology. The MEMS transducer has an advantageous electrical switching characteristic since charge reversal effects are avoided and it is possible to ground the substrates of the upper and lower MEMS layer structures as well as significant semiconductor volumes of the active MEMS layer structure.

In example configurations of the present invention, the at least one lamella is laterally movably guided at least in sections in an active region of the active MEMS layer structure. For increasing the stability of the layer structure, the at least one contact element is preferably formed in a frame region bordering the active region at the edge. The active region with the movable lamella is preferably bordered in the lateral direction at least in sections, preferably completely, by the frame region and in the vertical direction by the upper and lower MEMS layer structures.

Preferably, according to an example embodiment of the present invention, the at least one lamella is mechanically connected to the upper and lower MEMS layer structures at opposite support points in the frame region and is clamped between the opposite support points in such a way that the lamella can vibrate for interacting with the fluid at least in an intermediate portion. The lamella to which voltage can be applied is preferably electrically insulated from the upper and the lower MEMS layer structure at the support points.

In advantageous configurations of the present invention, at least one fixed support wall is formed in the active MEMS layer structure of the active region and is mechanically connected to the upper and the lower MEMS layer structure, in particular by means of a wafer bond. The support wall serves in particular as a spacer between the upper and the lower MEMS layer structure in order to ensure a sufficiently large distance between these layer structures for the lateral deflection of the lamella. Preferably, the support wall divides the active region into subregions, in particular in a lateral direction.

In example configurations of the present invention, the at least one contact element is mechanically and electrically conductively connected to a stamp of the through-connection and, outside the through-connection, is mechanically connected to the upper and/or lower MEMS layer structure in at least one contact region spaced apart from the through-connection in the lateral direction. In configurations, the contact element can also be electrically conductively connected to a drive electrode of the upper and/or lower MEMS layer structure in a contact region spaced apart from the through-connection in the lateral direction.

In example configurations of the present invention, the at least one contact element has at least one cutout or an isolation trench. The cutout or isolation trench spaces apart the contact element from the upper and/or lower MEMS layer structure in a portion located between the through-connection and the at least one contact region, in order to provide electrical isolation. In this way, short circuits can be avoided or insulation structures on the upper or lower MEMS layer structure can be bridged in the lateral direction.

In possible configurations of the present invention, the at least one contact element has a substantially H-shaped or Y-shaped cross-sectional shape in a cross-section perpendicular to the layer sequence direction.

In example configurations of the present invention, the at least one contact element in the region outside the through-connection is connected at least in sections to a conductive path layer, in particular made of polycrystalline silicon, which is flush with the upper and/or lower MEMS layer structure and which is electrically insulated from the substrate of the upper or lower MEMS layer structure by an insulation layer. In other words, the contact element is connected to the upper and/or lower MEMS layer structure in some regions via a stripped conductive path layer in order to provide sufficient electrical isolation and minimize voltage input to the substrates of the upper and/or lower MEMS layer structure.

According to an example embodiment of the present invention, for deflecting the lamella, alternating electric fields are applied to the upper and/or lower drive electrodes. In typical configurations of the present invention, the independent provision of a plurality of, for example five, electrical potentials is provided for this purpose, with each potential being supplied via one of the contact elements described above and below. Each contact element is electrically conductively connected to at least one lower drive electrode of the lower electrode arrangement or an upper drive electrode of the upper electrode arrangement. In configurations, at least one of the contact elements is electrically conductively connected to a lower drive electrode of the lower electrode arrangement and an upper drive electrode of the upper electrode arrangement.

In example configurations of the present invention, at least one first contact element is provided for applying a first potential and is electrically conductively connected to a lower drive electrode of the lower electrode arrangement. At least one second contact element for applying a second potential is electrically conductively connected to an upper drive electrode of the upper electrode arrangement. For applying a third potential, in particular to the lamellae, a third contact element is electrically conductively connected to a further upper drive electrode and a further lower drive electrode.

Applications of the MEMS transducer include in particular microelectromechanical loudspeakers, pumps and valves for microfluidics and the like.

Further details and advantages of the present invention are explained in more detail below with reference to the exemplary embodiments shown in the figures.

BRIEF DESCRIPTION OF THE DRAWINGS

Identical or corresponding elements are provided with the same reference signs in all figures.

DETAILED DESCRIPTION OF EXAMPLE EMBODIMENTS

Figure 1:
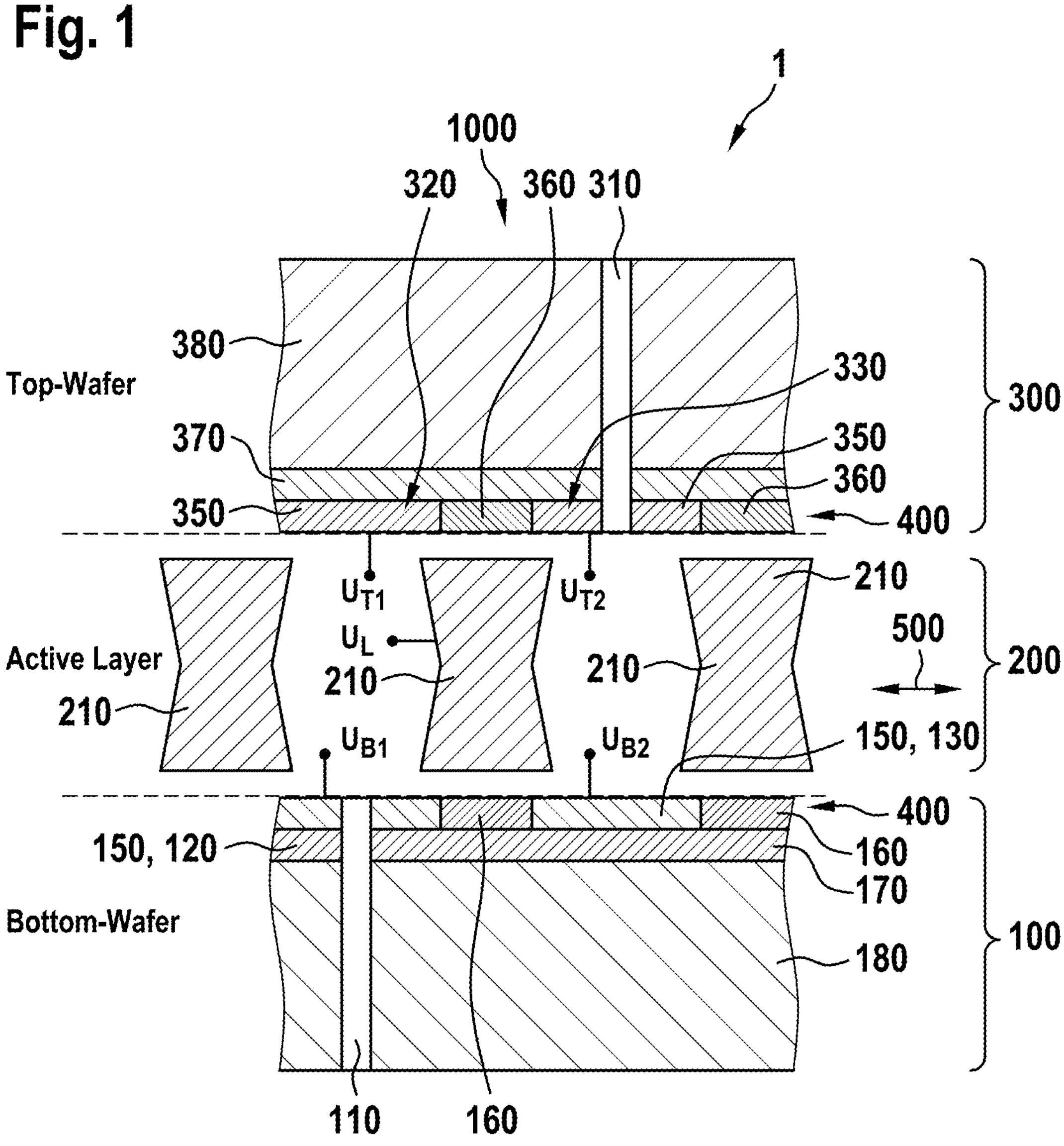
FIG. 1 is a cross-sectional view of an active region of a MEMS transducer with a plurality of movable lamellae for interacting with a fluid, according to an example embodiment of the present invention.

The figures show a MEMS transducer 1 that can be produced by means of wafer bonding, in particular fusion bonding, from a layer structure of three MEMS layer structures 100, 200, 300 provided with conductive paths and/or insulation layers.

The figures illustrate exemplary embodiments in which a through-connection 310 is provided in an upper MEMS layer structure 300 by way of example. It is to be understood that this is to be interpreted in a non-restrictive manner and, in particular, that correspondingly inverted arrangements in which the through-connection 310 is provided in a lower MEMS layer structure 100 can be taken directly and equivalently from the present disclosure.

FIG. 1 shows a cross-section of an active region 1000 of the MEMS transducer 1 with an active MEMS layer structure 200 arranged between a lower MEMS layer structure 100 and an upper MEMS layer structure 300.

In the active MEMS layer structure 200, a plurality of lamellae 210 arranged in parallel with one another is formed, which are controllable and deflectable by means of electrical potentials UB1, UB2, UL, UT1, UT2. The lamellae 210 are movable in the lateral direction 500 at least in sections in the main extension plane of the MEMS transducer 1. The lamellae 210 are anchored at their ends in a frame region 1500, cf. in particular FIGS. 2 to 4, which borders the active region 1000 at the edge.

The lower MEMS layer structure 100 forms a base structure and the upper MEMS layer structure 300 forms a cover structure for a cavity in which the movable lamellae 210 are arranged. For interacting with a fluid, in particular for sound generation, through-openings 110, 310 are introduced into the lower MEMS layer structure 100 or into the upper MEMS layer structure 300.

A drive device 400 for controlling the movable lamellae 210 comprises upper drive electrodes 350, 390 of first and second upper electrode arrangements 320, 330 and lower drive electrodes 150, 190 of first and second lower electrode arrangements 120, 130 for applying the alternating electric fields, in particular the electric potentials UB1, UB2, UL, UT1, UT2. The lower drive electrodes 150 of the first lower electrode arrangement 120 and of the second lower electrode arrangement 130 are electrically insulated from one another in the lateral direction 500 by lower isolation regions 160. Correspondingly, the upper drive electrodes 350 of the first upper electrode arrangement 320 and the second upper electrode arrangement 330 are electrically insulated from one another in the lateral direction 500 by upper isolation regions 360. An upper substrate 380, for example made of silicon, of the upper MEMS layer structure 300 is electrically insulated from the upper electrode arrangements 320, 330 in the layer sequence direction by an upper insulation layer 370. Correspondingly, a lower substrate 180 of the lower MEMS layer structure 100 is electrically insulated from the lower electrode arrangements 120, 130 in the layer sequence direction by a lower insulation layer 170.

The drive electrodes 150, 190, 350, 390 of the upper and/or lower electrode arrangements 120, 130, 320, 330 are designed, for example, as highly doped polycrystalline silicon structures and can preferably be produced by means of layer deposition.

Figure 2:
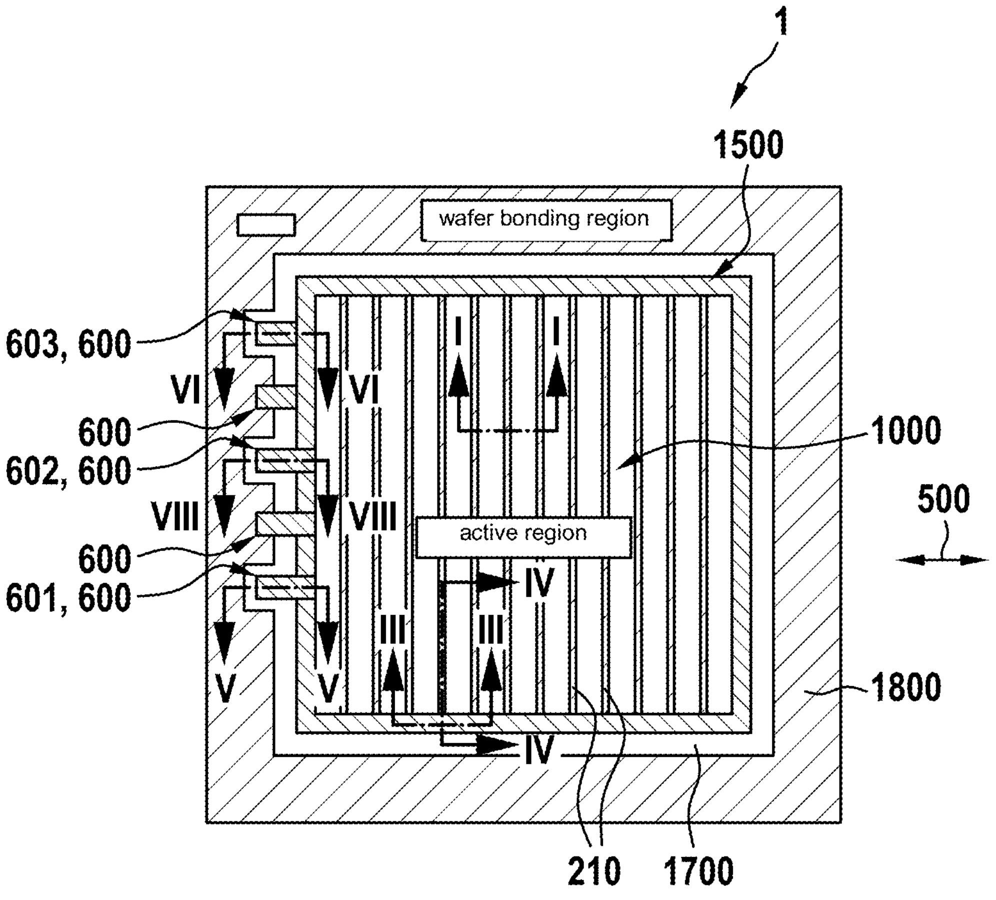
FIG. 2 shows the MEMS transducer in a sectional view in the main extension plane, according to an example embodiment of the present invention.

FIG. 2 shows the MEMS transducer 1 with the active region 1000 in a sectional view, the drawing plane shown corresponding to the main extension plane of the MEMS transducer 1. The lower, upper, and active MEMS layer structures 100, 200, 300 are connected to one another at the edges in a wafer bonding region 1800. The active region 1000 is surrounded by the frame region 1500, which is separated from the wafer bonding region 1800 by a peripheral isolation gap 1700.

The potentials UB1, UB2, UL, UT1, UT2 are supplied via contact elements 600, which are shown in cross-section in particular in FIGS. 5 to 8. The sectional planes shown in FIGS. 1, 3 to 6, and 8 are denoted by Roman numerals in FIG. 2.

Figure 4:
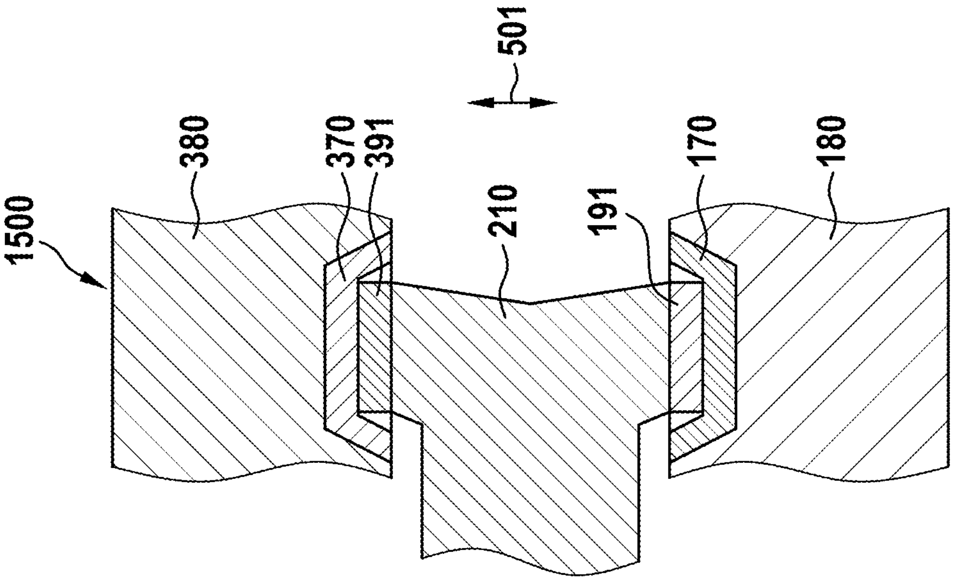
FIG. 4 is a second cross-sectional view of the support point of FIG. 3 in a drawing plane perpendicular to FIG. 3.
Figure 3:
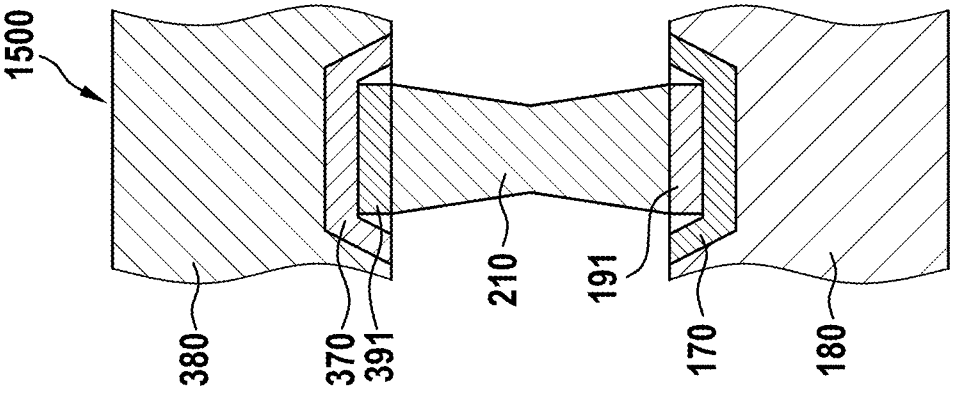
FIG. 3 is a first cross-sectional view of a support point formed in a frame region of an active MEMS layer structure for connecting a movable lamella of the MEMS transducer, according to an example embodiment of the present invention.

FIGS. 3 and 4 show the anchoring of the live lamellae 210 at a support point in the frame region 1500. The lamellae 210 are mechanically connected to an upper conductive path layer 391 and to a lower conductive path layer 191, which are respectively electrically insulated from the substrates 380, 180 of the upper and lower MEMS layer structure 300, 100 by upper and lower insulation layers 391, 191. The lamellae 210 are clamped between the upper and the lower MEMS layer structure 300, 100 and anchored at their opposite ends in the frame region 150. In the vertical direction 501, the lamellae 210 have a reduced structural height in order to ensure mobility of the lamellae 210 and sufficient electrical isolation from the upper and/or lower electrode arrangements 120, 130, 320, 330 or from the upper and the lower MEMS layer structure 300, 100.

FIGS. 5 to 8 show contact elements 600 for supplying the electrical potentials UB1, UB2, UL, UT1, UT2. Each contact element 600 is connected to a through-connection 381, which is designed as a through-silicon via, in the substrate 380 of the upper MEMS layer structure 300. The through-connection 391 has a stamp 383 which is electrically insulated from the substrate 380 by a peripheral isolation 382 and provided with a metallization 384 on the upper side of the upper MEMS layer structure 300 for applying an electrical potential UB1, UB2, UL, UT1, UT2.

The contact elements 600 are formed in the active MEMS layer structure 200 and are directly connected to the stamp 383, in particular by means of wafer bonding. The contact elements 600 provide mechanical support for the stamp 383 and are connected, for this purpose, at least to the lower MEMS layer structure 100, cf. in particular FIG. 5, indirectly via intermediate conductive path layers 191, in particular made of polycrystalline silicon, and insulation layers 170. The contact elements 600 and the substrates 180, 380 of the upper and lower MEMS layer structures 100, 300 are electrically insulated from one another and can be grounded accordingly.

Figure 5:
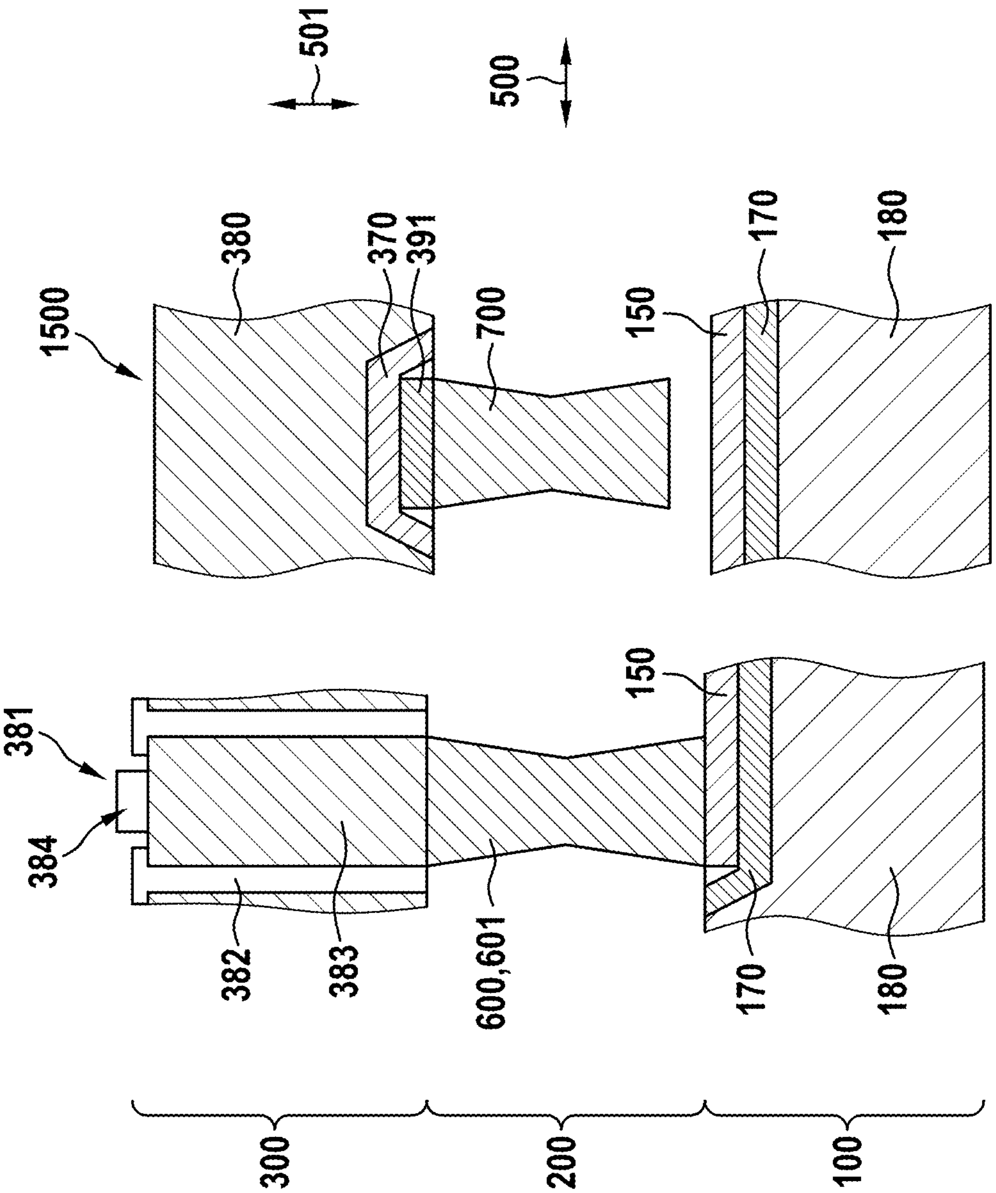
FIG. 5 shows a contact element between a through-connection in the upper MEMS layer structure and a lower drive electrode of a lower electrode structure, according to an example embodiment of the present invention.
Figure 7:
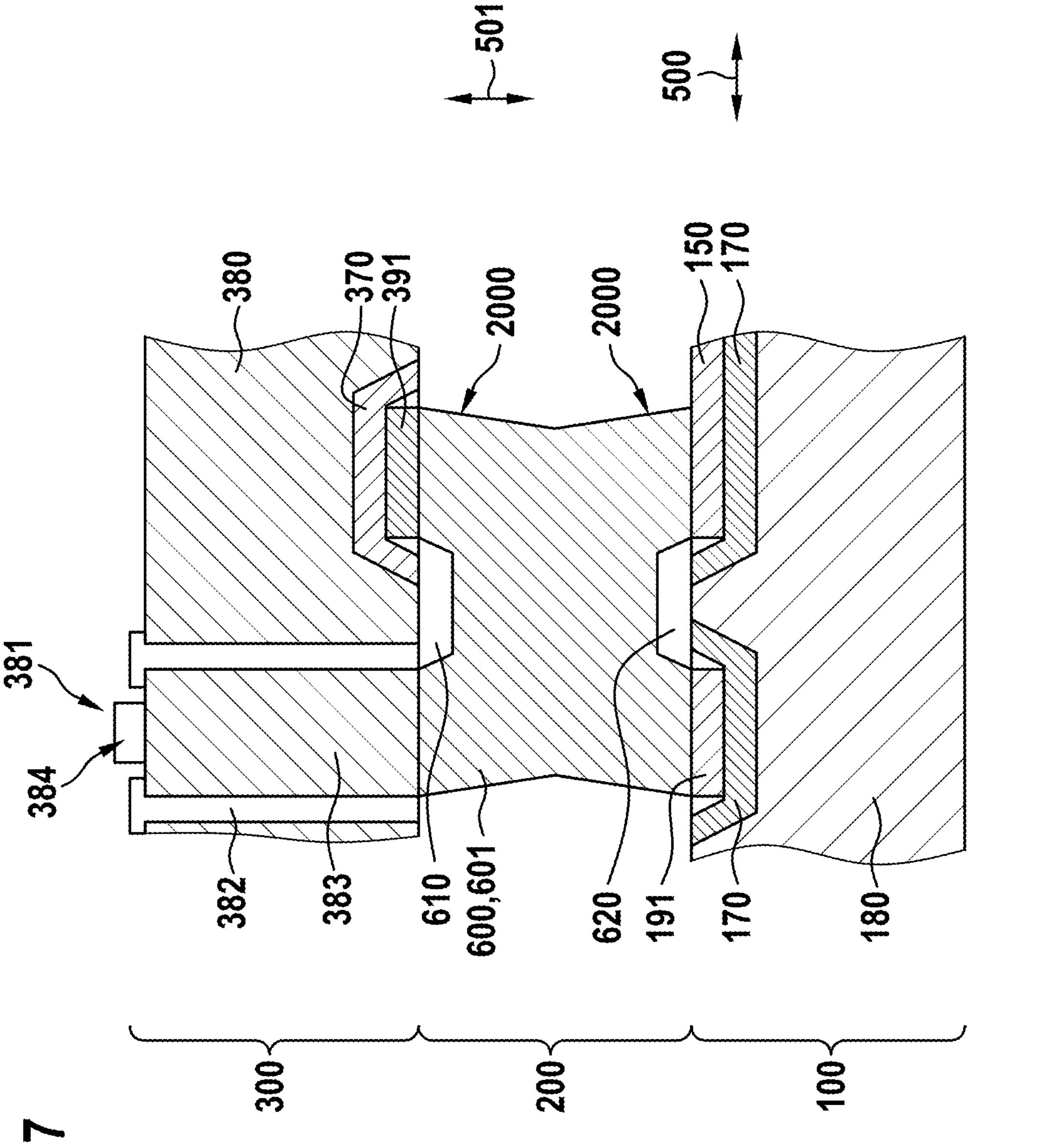
FIG. 7 shows a contact element between a through-connection in the upper MEMS layer structure and a lower drive electrode of a lower electrode structure in an alternative embodiment to FIG. 5, according to an example embodiment of the present invention.

The first electrical potentials UB1, UB2 are supplied via first contact elements 601, as shown by way of example in FIGS. 5 and 7. The first contact element 601 is electrically conductively connected to a lower drive electrode 150 of the lower electrode arrangement 120, 130.

FIG. 5 shows an embodiment in which the first contact element 601 has an I-shaped cross-section. FIG. 5 also shows the region where the lower drive electrode 150 passes through the frame region 1500 into the active region 1000 of the MEMS transducer 1. A frame element 700 of the frame region 1500 is indirectly connected to the upper MEMS layer structure 100 via an upper conductive path layer 391, which is electrically insulated from the substrate 380 by an insulation layer 370. The frame element 700 has a structural height so that an insulating gap is formed between the lower drive electrode 150 and the frame element 700. The frame element 700 can thus in particular be at a different electrical potential than the lower drive electrode 150.

FIG. 7 shows an alternative embodiment with a substantially H-shaped cross-section. Here, the first contact element 601 is mechanically and electrically conductively connected to the stamp 383 of the through-connection 381 and, outside the through-connection 383, is connected at a plurality of points to upper and lower conductive path layers 391, 191 of the upper and lower MEMS layer structures 300, 100 and to the lower drive electrode 150. The upper and the lower conductive path layer 391, 191 and the lower drive electrode 150 are electrically insulated from the substrates 380, 180 of the upper and lower MEMS layer structures 300, 100 by upper and lower insulation layers 370, 170. For increasing the stability of the layer structure, the first contact element 601 designed to contact the lower drive electrode 150 is mechanically connected to the upper and lower MEMS layer structures 300, 100 in a contact region 2000, which is spaced apart from the through-connection 383 in the lateral direction 500. The first contact element 601 has cutouts 610, 620, which space apart and electrically insulate the first contact element 601 from the upper and/or lower MEMS layer structure 300, 200 in the region portion located between the through-connection 381 and the contact region 2000.

Figure 8:
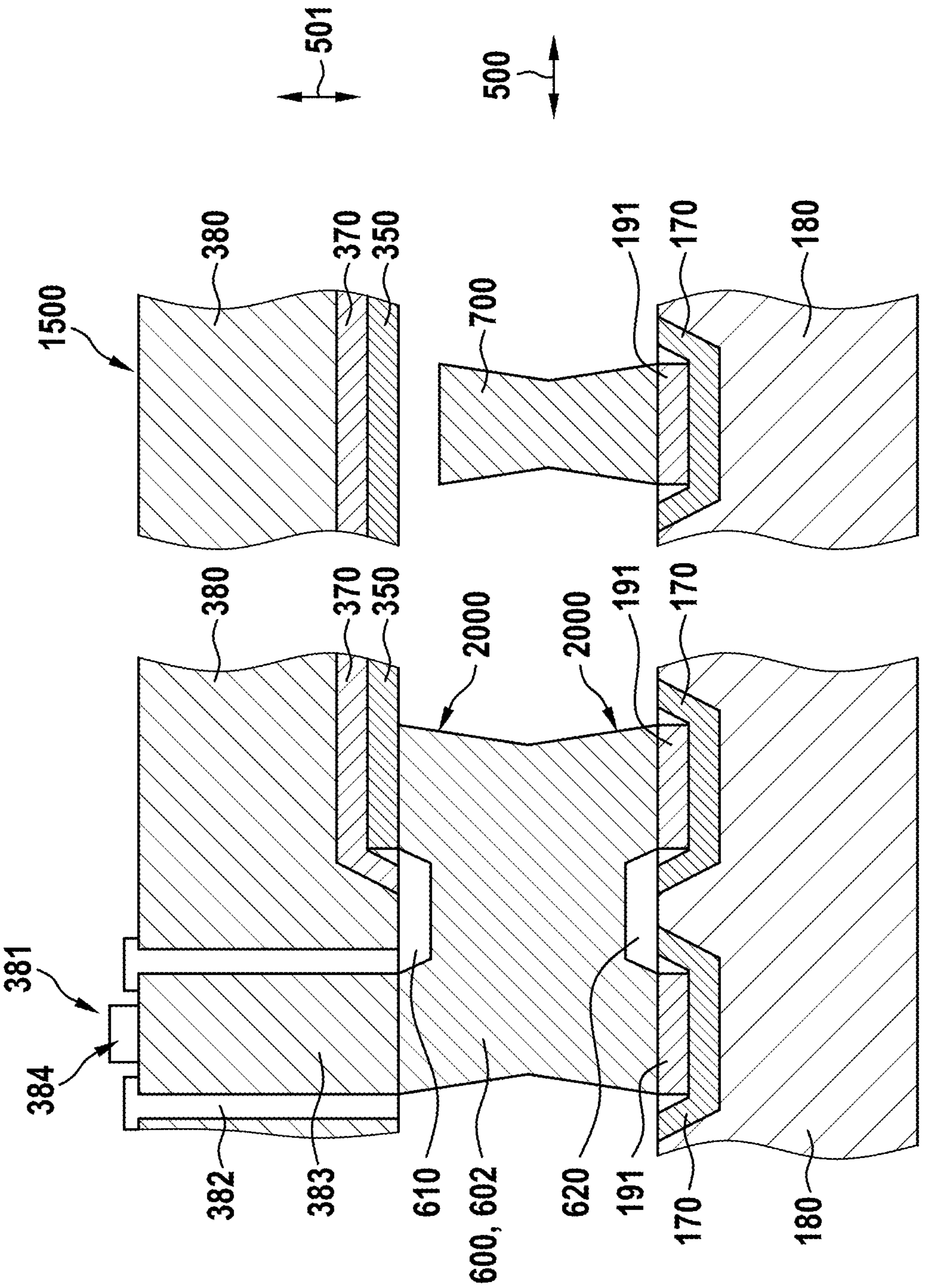
FIG. 8 shows a contact element between a through-connection in the upper MEMS layer structure and an upper drive electrode of an upper electrode structure, according to an example embodiment of the present invention.

For supplying second potentials UT1, UT2 to the upper drive electrodes 350, second contact elements 602 are provided, an exemplary embodiment of the second contact element 602 being shown in FIG. 8. In contrast to the embodiment shown in FIG. 7, the second contact element 602 is electrically conductively connected to the upper drive electrode 350 in the contact region 2000 and is mechanically supported there on a region of a lower conductive path layer 191 that is stripped through an insulation layer 170. The second contact element 602 also has the cutouts 610, 620 in order to ensure electrical isolation of the second contact element 602 in the region between the through-connection 381 and the contact region 2000.

The live upper drive electrode 350 passing through the frame region 1500 into the active region 1000 of the MEMS transducer 1 is also shown in FIG. 8. Here, the frame element 700 of the frame portion 1500 is indirectly connected to the lower MEMS layer structure 100 via a lower conductive path layer 191 which is electrically insulated from the substrate 180 of the lower MEMS layer structure 100 by an insulation layer 170, wherein an insulating gap is formed between the upper drive electrode 350 and the frame element 700. The frame element 700 can thus in particular be at a different electrical potential than the upper drive electrode 350.

Figure 6:
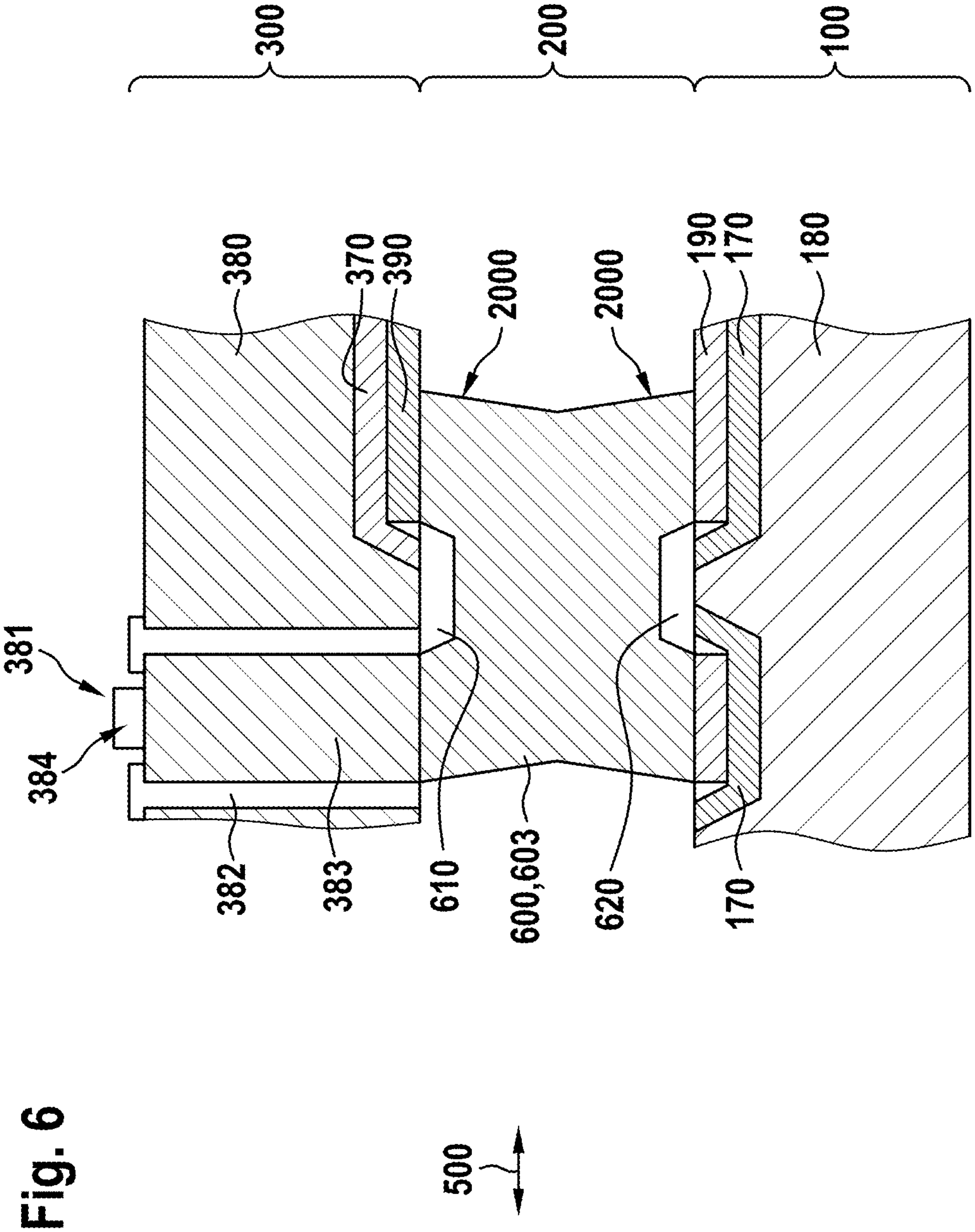
FIG. 6 shows a contact element between a through-connection in the upper MEMS layer structure and a lower and an upper drive electrode, in particular for applying an electrical potential to movable lamellae, according to an example embodiment of the present invention.

For supplying a third potential UL to the upper and lower drive electrodes 390, 190, third contact elements 603 are provided, which are shown in an exemplary embodiment in FIG. 6. In contrast to the embodiments shown in FIGS. 7 and 8, the third contact element 603 is mechanically and electrically conductively connected in the contact region 2000 to further upper and lower drive electrodes 390, 190, in particular for applying a voltage to the lamellae 210.

Figure 9:
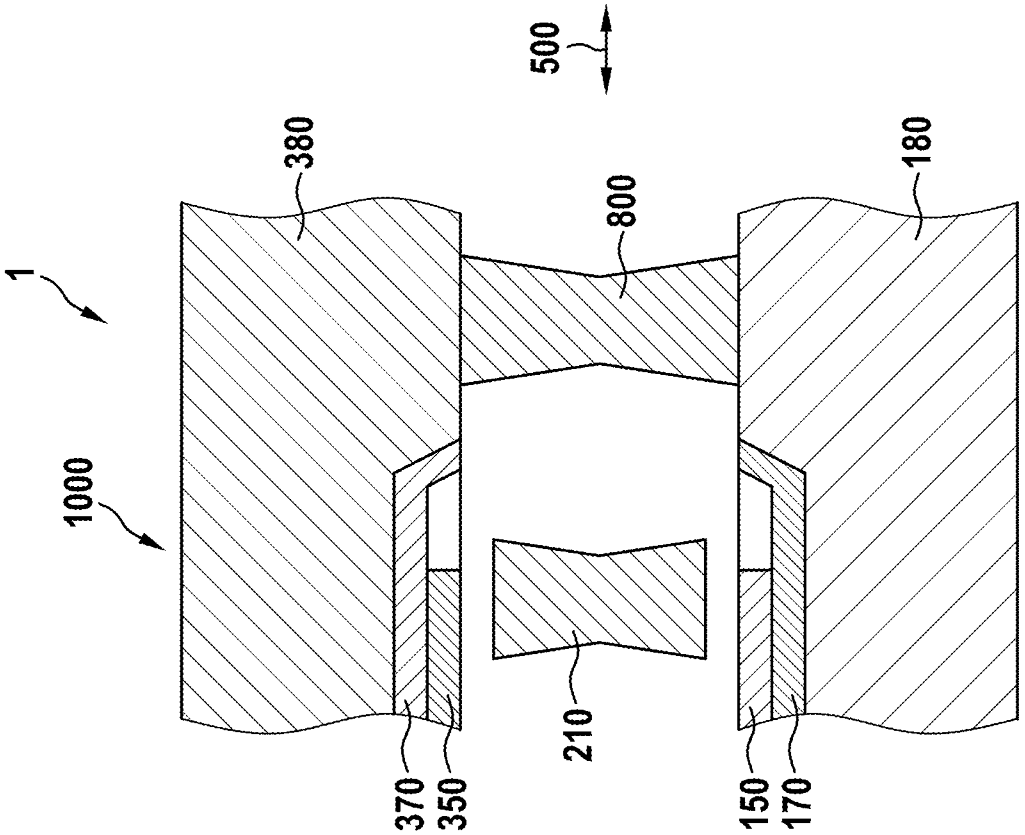
FIG. 9 shows a support wall formed in the active region of the active MEMS layer structure, according to an example embodiment of the present invention.

FIG. 9 shows a portion of the active region 1000 of the MEMS transducer 1 in cross-section. A fixed support wall 8000 is formed in the active MEMS layer structure 200 of the active region 1000, is mechanically connected directly, for example by means of wafer bonding, to the upper and the lower MEMS layer structure 300, 100 and divides the active region 1000 into subregions. The support wall 800 in particular serves as a spacer in order to ensure a substantially constant distance between the upper and lower MEMS layer structures 300, 100 in the active region 1000.

What is claimed is:

1. A MEMS transducer for interacting with a fluid, comprising:

a layer stack of at least three MEMS layer structures arranged one above the other in a layer sequence, an active MEMS layer structure of the layer stack being formed between a lower MEMS layer structure of the layer stack and an upper MEMS layer structure of the layer stack;

at least one lamella which is formed in the active MEMS layer structure and is deflectable laterally at least in sections for interacting with the fluid; and a drive device configured to deflect the lamella at least in sections in a lateral direction perpendicular to the layer sequence, with a lower and/or upper electrode structure, which is formed adjacent to the active MEMS layer structure on the lower MEMS layer and/or upper MEMS layer structure;

wherein, for applying an electrical voltage to the upper and/or lower electrode structure, a through-connection of the upper or lower MEMS layer structure is provided, which is electrically conductively connected to at least one contact element formed in the active MEMS layer structure, the at least one contact element being mechanically connected to the upper and the lower MEMS layer structure and being electrically conductively connected to at least one drive electrode of the upper and/or the lower electrode structure and being insulated from a substrate of the upper and lower MEMS layer structures in a region outside the through-connection.

2. The MEMS transducer according to claim 1, wherein the at least one lamella is laterally movably guided at least in sections in an active region of the active MEMS layer structure, the at least one contact element being formed in a frame region bordering the active region at an edge of the active region.

3. The MEMS transducer according to claim 2, wherein the at least one lamella is mechanically connected to the upper and the lower MEMS layer structure at opposite support points in the frame region and is electrically insulated from the upper and the lower MEMS layer at the support points.

4. The MEMS transducer according to claim 2, wherein at least one fixed support wall is formed in the active region of the active MEMS layer structure and is mechanically connected to the upper and the lower MEMS layer structure.

5. The MEMS transducer according to claim 4, wherein the support wall divides the active region into subregions.

6. The MEMS transducer according to claim 1, wherein the at at least one contact element is mechanically and electrically conductively connected to a stamp of the through-connection and, outside the through-connection, is mechanically connected to the upper and/or lower MEMS layer structure in at least one contact region spaced apart from the through-connection in a lateral direction.

7. The MEMS transducer according to claim 6, wherein the at least one contact element has at least one cutout, the cutout spacing apart and electrically insulating the contact element from the upper and/or lower MEMS layer structure in a portion located between the through-connection and the at least one contact region.

8. The MEMS transducer according to claim 1, wherein the at least one contact element has a substantially H-shaped or Y-shaped cross-sectional shape.

9. The MEMS transducer according to claim 1, wherein the at least one contact element is connected in the region outside the through-connection at least in sections to a conductive path layer which is flush with the upper and/or lower MEMS layer structure and is electrically insulated from the substrate of the upper or lower MEMS layer structure by an insulation layer.

10. The MEMS transducer according to claim 1, wherein the at least one contact element is electrically conductively connected to a lower drive electrode of the lower electrode structure and an upper drive electrode of the upper electrode structure.

11. The MEMS transducer according to claim 1, wherein the at least one contact element includes at least one first contact element, which is electrically conductively connected to a lower drive electrode of the lower electrode structure, at least one second contact element, which is electrically conductively connected to an upper drive electrode of the upper electrode structure, and a third contact element, which is electrically conductively connected to a further upper drive electrode and a further lower drive electrode.

* * * * *